(12) United States Patent
McCoy et al.

(10) Patent No.: US 7,701,192 B2
(45) Date of Patent: Apr. 20, 2010

(54) SYSTEM AND METHOD FOR REMOVAL OF FREQUENCY-DEPENDENT TIMING DISTORTION

(75) Inventors: Steve McCoy, Eden Prairie, MN (US); John David Hamre, Plymouth, MN (US)

(73) Assignee: Gigamax Technologies, Inc., Eden Prairie, MN (US)

( * ) Notice: Subject to any disclaimer, the term of this patent is extended or adjusted under 35 U.S.C. 154(b) by 126 days.

(21) Appl. No.: 11/893,776

(22) Filed: Aug. 17, 2007

(65) Prior Publication Data

US 2009/0045863 A1 Feb. 19, 2009

(51) Int. Cl.
*G01R 31/00* (2006.01)

(52) U.S. Cl. .................................. 324/76.11; 324/76.39
(58) Field of Classification Search .............. 324/76.11, 324/76.39; 702/89
See application file for complete search history.

(56) References Cited

U.S. PATENT DOCUMENTS

| 4,982,350 A * | 1/1991 | Perna et al. .................... 702/89 |
| 2006/0262010 A1* | 11/2006 | Sato ........................ 342/357.02 |

* cited by examiner

*Primary Examiner*—Vincent Q Nguyen

(57) ABSTRACT

A method of preparing a signal for measurement includes receiving the signal and selecting a first edge and a second edge within the signal. The method also includes delivering the first edge to a time interval measurement system after expiration of a first delay period and delivering the second edge to a time interval measurement system after expiration of a second delay period.

20 Claims, 7 Drawing Sheets

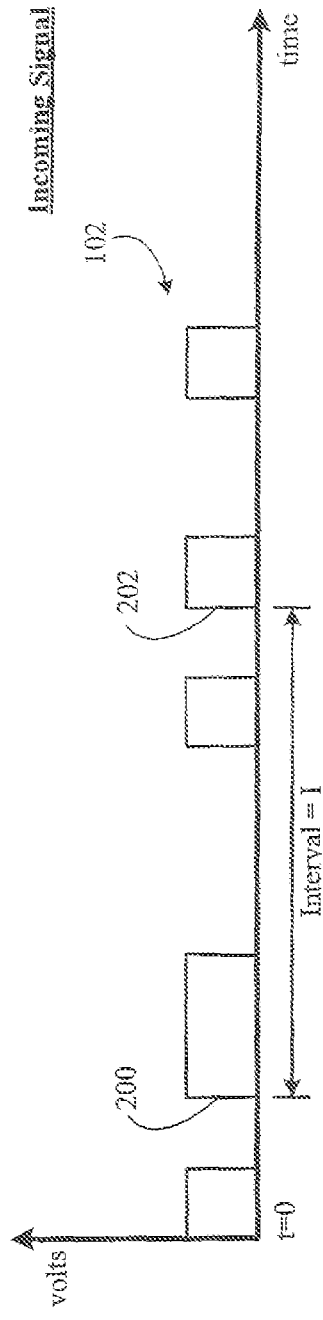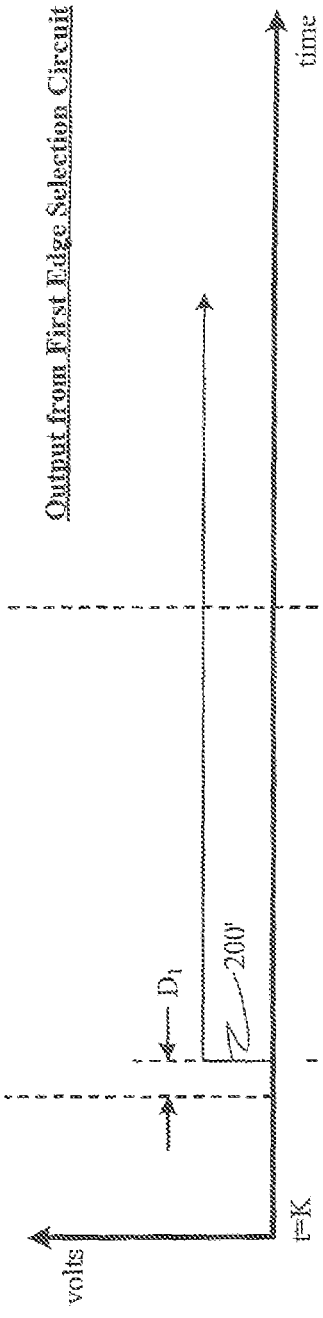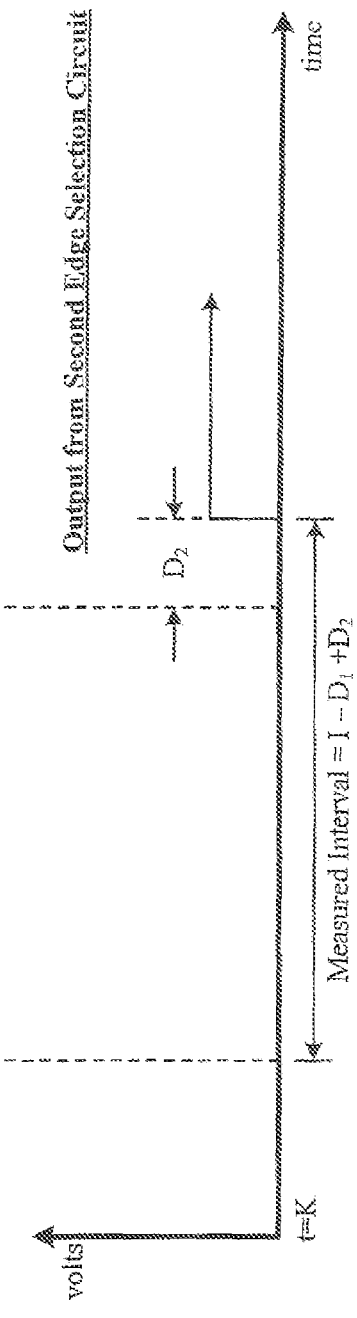
FIG. 2A PRIOR ART
FIG. 2B PRIOR ART
FIG. 2C PRIOR ART

SYSTEM AND METHOD FOR REMOVAL OF FREQUENCY-DEPENDENT TIMING DISTORTION

TECHNICAL FIELD

This document relates generally to a time interval measurement system and method for use in connection with signals, such as data, communication, and/or clock signals, and more particularly to a system and method for removal of frequency-based distortion of such time interval measurements.

BACKGROUND

In the context of circuit design, it is commonplace to evaluate the data communication pathways interconnecting various circuits within a system. Oftentimes, in performing such tests, it is necessary to measure the span of time between two logic level transitions within a signal (or between two transitions in different signals) that has propagated through a communication pathway to be evaluated. For example, in performing such an evaluation, one may wish to measure the span of time between the second rising edge and fourth rising edge in a data signal that has propagated through a communication pathway under test.

FIG. 1 depicts an exemplary system for performing such a measurement. As can be seen from FIG. 1, the exemplary system includes a limiting amplifier 100 that receives a signal 102 that has propagated through a pathway (not depicted in FIG. 1) to be evaluated. The limiting amplifier 100 generates at its output 104 an amplified, isolated output signal that includes the same data transitions as those exhibited by the input signal 102. Of course, the limiting amplifier 100 exhibits a small delay period, c, meaning that a logic level transition occurring at time $t_0$ at the input of the limiting amplifier 100 is witnessed at time $t_0+c$ at the output 104 thereof.

The output of the limiting amplifier 100 is delivered to a first edge selection system 106, a second edge selection system 108, and an arming circuit 110. The first edge selection system 106 includes an amplifier 112, which functions in the same manner as the aforementioned limiting amplifier 100. Thus, the output of the amplifier 112 is essentially an isolated and slightly delayed replica of the input signal 102. The output of the amplifier 112 is delivered to an edge selection circuit 114. The edge selection circuit 114 is composed of flip flops, counters, and other combinatorial logic arrangements. The edge selection circuit 114 is configured to select a particular logic level transition (also referred to herein as an "edge" or as a "transition") from the output data signal 102, and to deliver the selected edge to a time interval measurement system 116. Thus, for example, the edge selection circuit 114 may select the second rising edge from the signal 102. Per such a scenario, the arming circuit 110 instructs the edge selection circuit 114 when to begin counting rising edges within the data signal 102, and upon observation of the second rising edge, the edge selection circuitry 114 delivers that edge to the time interval measurement system 116. The second edge selection system 108 (comprised of amplifier 117 and edge selection circuitry 118) works in an identical manner, with the notable exception that it may select a different edge than is selected by the first edge selection system 106 (it may select the same edge, as well). The time interval measurement system 116 measures the interval of time between the two edges selected by the first and second edge selection systems 106 and 108.

FIGS. 2A-2C depict the behavior of the system of FIG. 1, assuming that the second and fourth rising edges have been selected for measurement. FIG. 2A depicts the incoming data signal 102 of FIG. 1. The second rising edge in the incoming data signal 102 is identified by reference numeral 200, and the fourth rising edge is identified by reference numeral 202. As can be seen, an ideal measurement of the interval of time between these two edges yields a quantity of I.

It should be noted that for the purpose of discussion of the subject matter herein, the logic level transitions are depicted and described as vertical "edges," such that a transition from a logic level low to a logic level high, or vice versa, is described as occurring instantly. Of course, a logic level transition occurring in an actual system occurs over a span of time. The edges depicted herein can be thought of as occurring at the instant in time at which the signal crosses a threshold (e.g., voltage threshold) that defines the distinction between a logical "0" from a logical "1."

FIG. 2B depicts the behavior exhibited at the output of the first edge selection circuit 114. The depiction is presented as a Cartesian plane, with time on the x-axis and voltage on the y-axis. Notably, time=K at the origin of the Cartesian plane. The term K is equal to the propagation delay of the signal 102 through the amplifiers 100 and 112. Thus, assuming that the first edge selection circuit 114 exhibited no propagation delay, the rising edge 200' (depicted in FIG. 2B) at the output thereof would appear vertically aligned with the rising edge 200 of the data signal (depicted in FIG. 2A). However, as can be seen from FIG. 2B, the first edge selection circuit 114 signal exhibits a propagation delay $D_1$. As can be seen from FIG. 2C, the second edge selection circuit 118 exhibits a propagation delay $D_2$. Thus, the interval between the second leading edge 200 and fourth leading edge 202, as measured by the interval measurement system 116, is $(I-D_1+D_2)$, instead of I.

As shown in FIG. 3, the propagation delay exhibited by an edge selection circuit 114 and/or 118 is a function of, amongst other variables, the frequency content of the signal propagating through the selection circuit. Thus, the propagation delays $D_1$ and $D_2$ constantly change, and simple addition/subtraction of a constant cannot achieve the end goal of correcting the measurement generated by the interval measurement system 116.

From the foregoing, it is evident that there exists a need by which distortions, such as frequency-dependent distortion (and other mechanisms, e.g., thermal), of interval measurements may be reduced.

SUMMARY

Against this backdrop, the present invention was developed. According to one aspect of the invention, a method of preparing a signal for measurement includes receiving the signal and selecting a first edge and a second edge within the signal. The method also includes delivering the first edge to a time interval measurement system after expiration of a first delay period and delivering the second edge to a time interval measurement system after expiration of a second delay period.

According to another aspect on the invention, a system for measurement of a time interval includes a first edge selection circuit configured to receive a signal, to select a first transition within the signal, said selection occurring over a first span of time, and to deliver the first selected transition to a first state device upon elapsing of the first span of time. The system also includes a second edge selection circuit configured to receive the signal, to select a second transition within the signal, said selection occurring over a second span of time, and to deliver the second selected transition to a second state device upon elapsing of the first span of time. The system further includes a first delay element configured to deliver a pulse to the first state device at a point in time following the elapsing of the first span of time, so that the first state device assumes a state determined by the first selected transition, and a second delay element configured to deliver a pulse to the second state device at a point in time following the elapsing of the second span of time, so that the second device assumes a state determined by the second selected transition.

According to yet another aspect of the invention, there is provided a method of preparing a signal for measurement. The method comprising receiving the signal, selecting a first edge within the signal, selecting a second edge within the signal, delivering the first edge to a time interval measurement system after expiration of a first delay period, and delivering the second edge to a time interval measurement system after expiration of the first delay period.

While the invention will be described with respect to preferred embodiment configurations, and with respect to preferred devices and example edge transitions, it will be understood that the invention is not to be construed as limited in any manner by either such configuration, preferred devices or example edge transitions described herein. Instead, the principles of this invention extend to any environment in which a first edge is delivered to a time interval measurement system after expiration of a first delay period and a second edge is delivered to a time interval measurement system after expiration of a second delay period. These and other variations of the invention will become apparent to those skilled in the art upon a more detailed description of the invention.

The advantages and features which characterize the invention are pointed out with particularity in the claims annexed hereto and forming a part hereof. For a better understanding of the invention, however, reference should be had to the drawings which form a part hereof and to the accompanying descriptive matter, in which there is illustrated and described a preferred embodiment of the invention.

BRIEF DESCRIPTION OF THE DRAWINGS

In the drawings in which like elements are identified with the same designation numeral:

FIG. 2A depicts an exemplary incoming data signal to the system FIG. 1.

FIG. 2B depicts the behavior exhibited at the output of the first edge selection circuit.

FIG. 2C depicts the behavior exhibited at the output of the second edge selection circuit.

DETAILED DESCRIPTION

Figure 1:
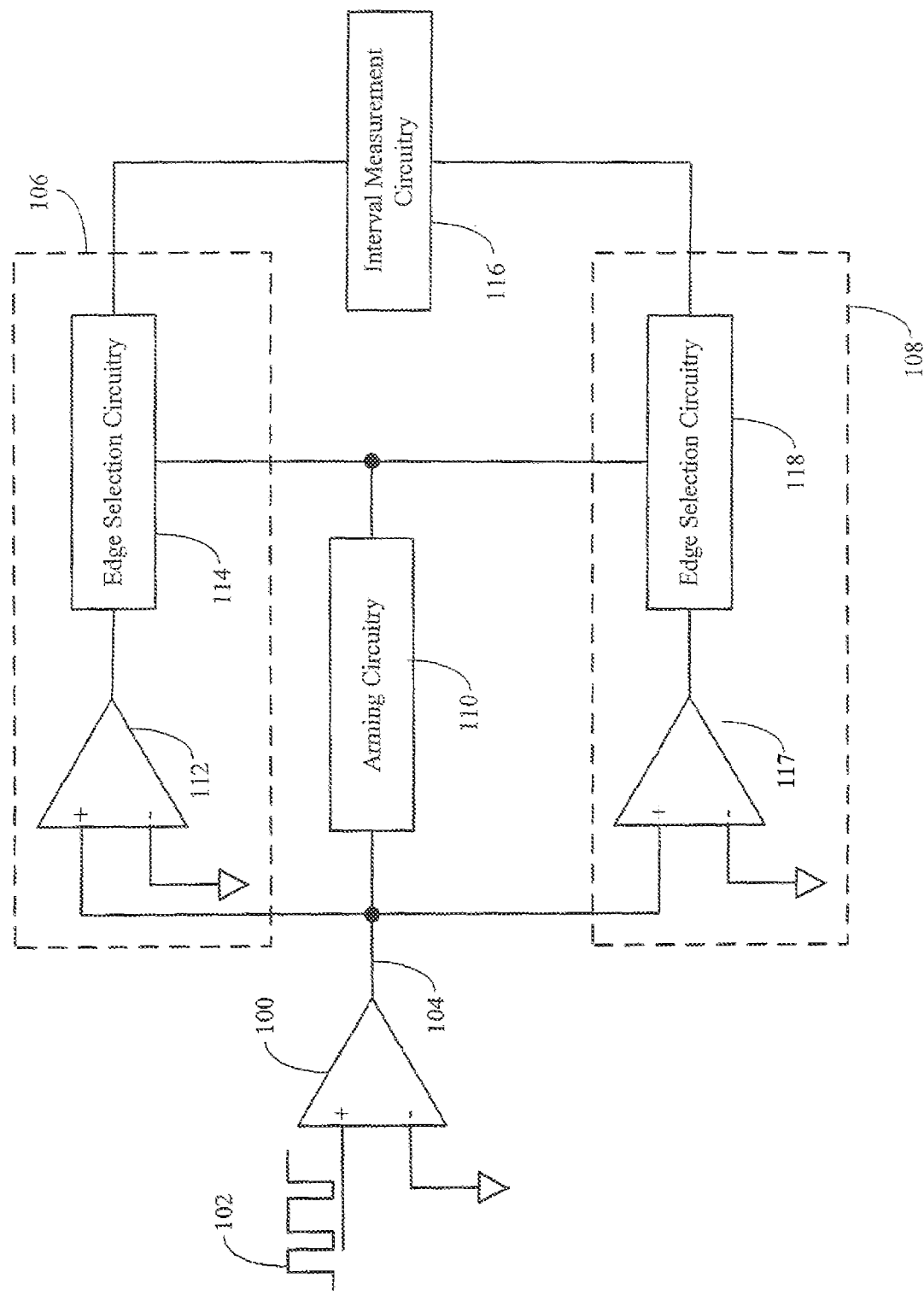
FIG. 1 depicts an exemplary embodiment of a system for measuring a time interval between logic level transitions.
Figure 3:
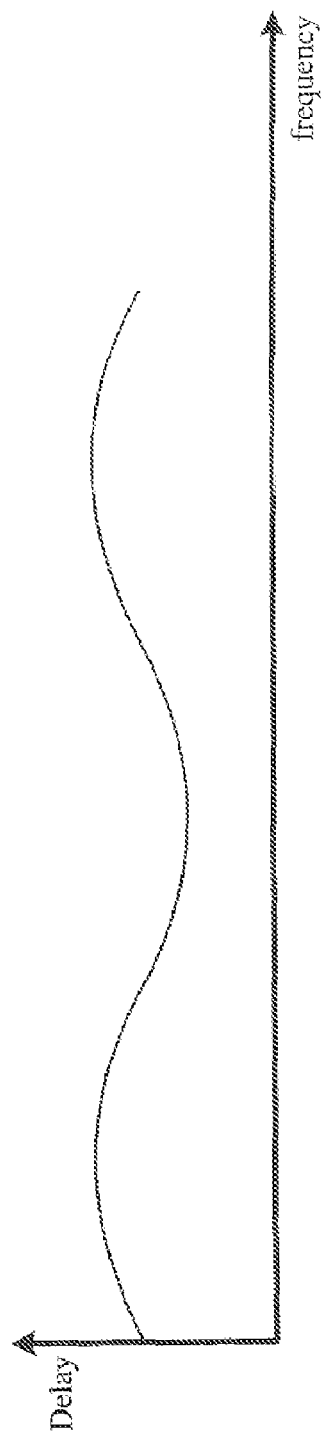
FIG. 3 depicts an exemplary relationship between a delay exhibited by an edge selection circuit of FIG. 1, and the frequency content of the incoming signal.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Figure 4:
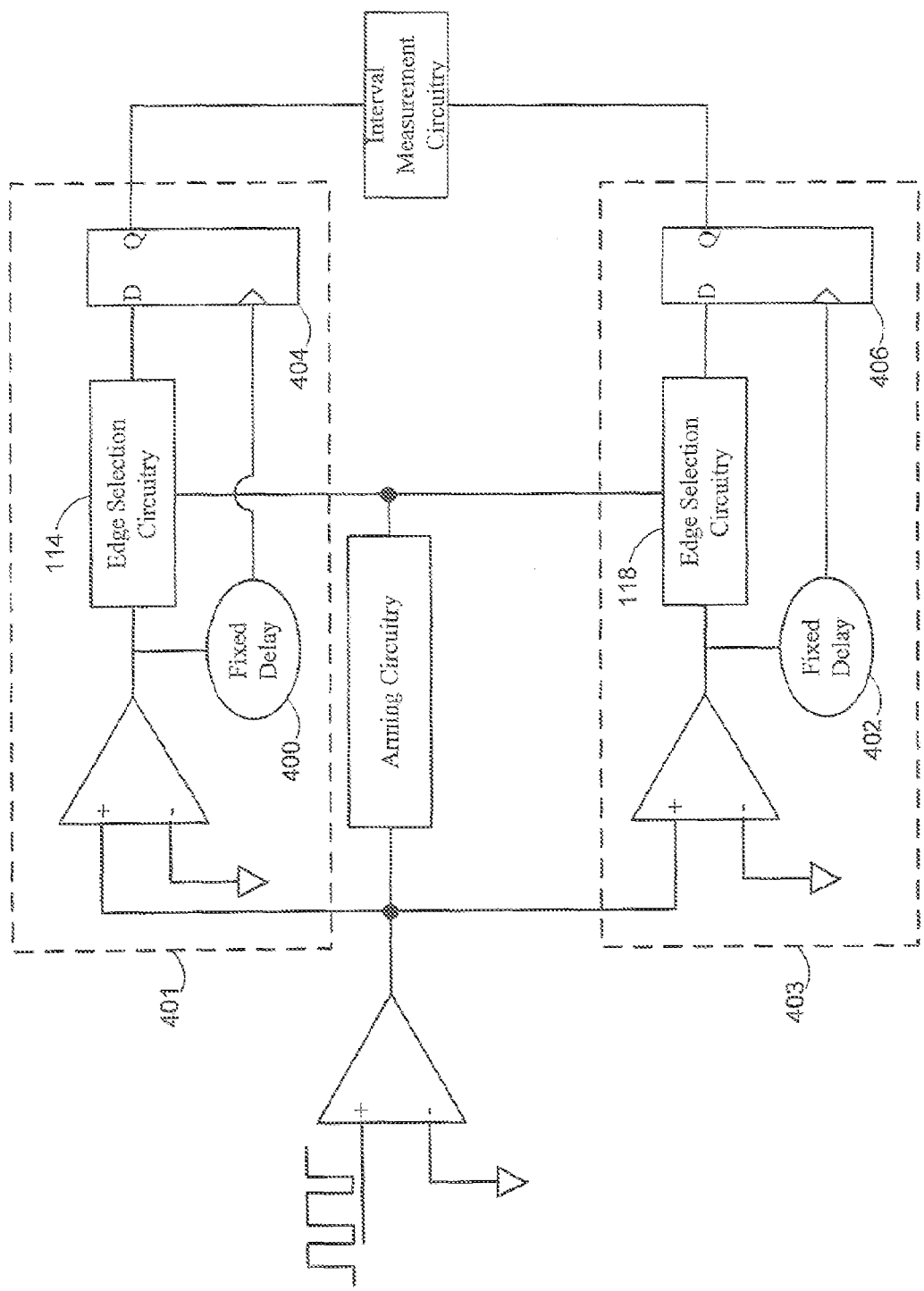
FIG. 4 depicts an exemplary embodiment of an improved system for measuring a time interval between logic level transitions.
Figure 5:
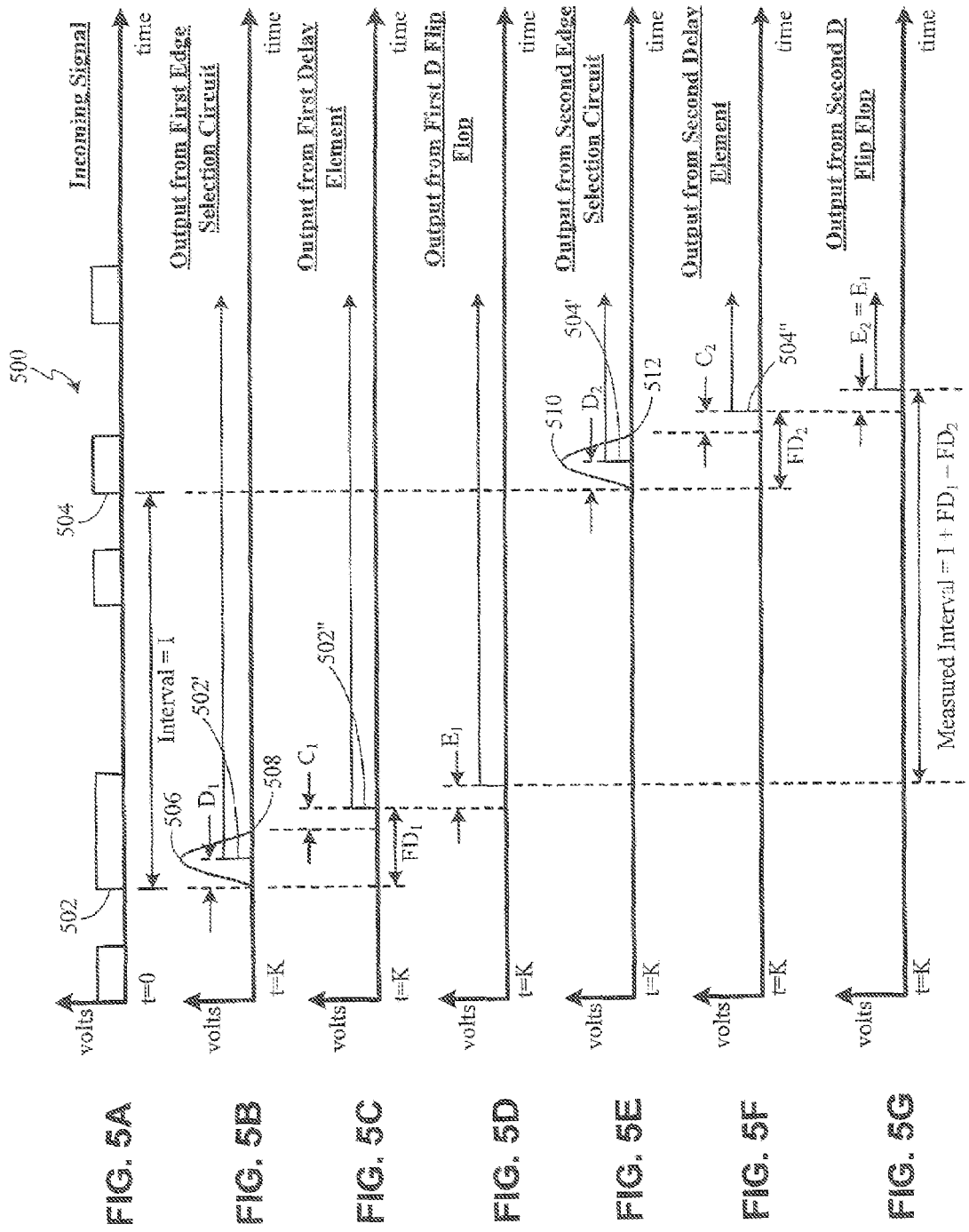
FIG. 5A depicts an exemplary incoming data signal to the system of FIG. 4.
FIG. 5B depicts the behavior exhibited at the output of the first edge selection circuit of the system of FIG. 4.
FIG. 5C depicts the behavior exhibited at the output of the first delay element of the system of FIG. 4.
FIG. 5D depicts the behavior exhibited at the output of the first D flip flop of the system of FIG. 4.
FIG. 5E depicts the behavior exhibited at the output of the second edge selection circuit of the system of FIG. 4.
FIG. 5F depicts the behavior exhibited at the output of the second delay element of the system of FIG. 4.
FIG. 5G depicts the behavior exhibited at the output of the second D flip flop of the system of FIG. 4.

Turning first to FIG. 4, a measurement system according to the present invention that minimizes the aforementioned frequency dependent distortion of time interval measurements is disclosed. The system of FIG. 4 may be identical to the system of FIG. 1, with the exception that four additional elements have been added thereto: (1) a first fixed delay element 400; (2) a second fixed delay element 402; (3) a first D-type flip flop 404; and (4) a second D-type flip flop 406.

As can be seen from FIG. 4, the signal propagating to the input of the first edge selection circuit 114 is split, and a portion thereof is delivered to a fixed delay element 400. The fixed delay element 400 is a device that conducts a signal from its input to its output, and exhibits a substantially fixed propagation delay in so doing. For example, according to one embodiment, the fixed delay element 400 is a coaxial cable, the length of which determines the propagation delay. Per such an embodiment, the propagation delay exhibited by the fixed delay element 400 is substantially independent of the frequency content or any other time related distortion of the signal propagating through the element 400, and is also substantially independent of other sources of distortion. Of course, it is understood that other elements achieve the similar effect of delivering a signal from an input to an output with a substantially fixed delay, and other such elements may be used in connection with the measurement schemes described herein.

The output of the fixed delay element 400 is coupled to the clock input of a D-type flip flop 404. The D-type flip-flop 404 operates so that the logic level exhibited at its D input at the time of a rising edge on its clock input is held on its output (Q), until the occurrence of the next rising edge at the clock input (at which time whatever logic level is exhibited at the D input is again held on the output, and so on).

By virtue of the structure of the system of FIG. 4, the data signal to be measured is split and travels along two paths toward the D-type flip flop 404: (1) a first path through the edge selection circuit 114; and (2) a second path through the fixed delay element 400. Such a state of affairs is useful in selecting a rising edge in the data signal (an exemplary embodiment of a system for detecting rising and falling edges is discussed below). If the delay exhibited by the delay element 400 is slightly longer than the delay exhibited by the edge selection circuit 114, then the flip flop 404 will transfer a selected rising edge (from edge selection circuit 114) to its output when it receives the slightly-more delayed rising edge (from the fixed delay element 400) at its clock pin.

It should be noted that the D-type flip flop 404 exhibits a delay, δ. Thus, if a rising edge is observed at the clock input of the flip flop 404 at time $t_0$, the logical "1" observed at the D input at time $t_0$ is observed at the output of the flip flop at time $t_0+δ$. The delay, δ, exhibited by the D-type flip flop 404 is substantially constant if the logic level provided to the D input of the flip flop 404 arrives in advance of the rising clock edge by a set-up time of C. For example, for some types of flip flops, C may be approximately 50 picoseconds, but it is to be understood that this value can vary substantially from one type of device to another. Accordingly the delay exhibited by the fixed delay element 400 should be chosen so as to be substantially equal to (or slightly greater than) the sum of the maximum delay exhibited through the edge selection circuit 114 and the aforementioned set-up time, C.

The second distortion-reduced edge selection system 403 works in an identical fashion as that just described with reference to the first distortion-reduced edge selection system 401. Thus, the system of FIG. 4 behaves as shown in FIGS. 5A-5G.

FIG. 5A depicts an incoming data signal 500. For the sake of illustration, it is assumed that the interval of time between the second and fourth rising edges 502 and 504 is to be measured. Thus, as can be seen from FIG. 5A, if measured ideally, the span of time between the second and fourth rising edges is equal to I.

FIG. 5B depicts the signal exhibited at the output of the first edge selection circuit 114. As can be seen, the first rising edge 502' exhibits a delay, $D_1$ as it propagates through the first edge selection circuit 114. Thus, the second rising edge 502 propagates through the first edge selection circuit 114 and arrives at the D input of the first flip flop 404 at a point in time $D_1$ seconds later than it was received by the first edge selection circuit 114.

FIG. 5C depicts the second rising edge 502", as it exits the first fixed delay element 400. As can be seen, the second rising edge 502" exhibits a fixed delay of $FD_1$ as it exits the first fixed delay element 400. As mentioned previously, the delay of an edge propagating through an edge selection circuit is not knowable in advance. However, the delay is known to fall within a distribution. Such a distribution is depicted by bell curve 506. (It is understood that the distribution of possible delays is not necessarily Gaussian. Bell curve 506 is presented for the sake of illustration only.) As can be seen, from FIG. 5B, the first edge selection circuit 400 exhibits a maximum delay, which is identified by reference numeral 508. $FD_1$ is chosen to be equal to (or slightly greater than) the sum of the maximum delay 508 exhibited by the first edge selection circuit 114 and the aforementioned set-up time, $C_1$, required by the first flip flop 404. Thus, the second rising edge 502 propagates through the fixed delay element 400 and arrives at the clock input of the first flip flop 404 at a point in time $FD_1$ seconds later than it was received by the first edge selection circuit 114. Accordingly, the first flip flop 404 presents the second rising edge 502 at its output at a point in time $FD_1+E_1$ seconds later than it was received by the first edge selection circuit 114, where $E_1$ represents the aforementioned substantially constant delay exhibited by the first flip flop 404 (this is depicted in FIG. 5D).

FIG. 5E depicts the signal exhibited at the output of the second edge selection circuit 118. As can be seen, the fourth rising edge 504' exhibits a delay, $D_2$ as it propagates through the second edge selection circuit 118. Thus, the fourth rising edge 504 propagates through the second edge selection circuit 118 and arrives at the D input of the second flip flop 406 at a point in time $D_2$ seconds later than it was received by the second edge selection circuit 118.

FIG. 5F depicts the fourth rising edge 504", as it exits the second fixed delay element 402. As can be seen, the fourth rising edge 504" exhibits a fixed delay of $FD_2$ as it exits the second fixed delay element 402. Once again, the delay of an edge propagating through an edge selection circuit is not knowable in advance. However, the delay is known to fall within a distribution. Such a distribution is depicted by bell curve 510. (It is understood that the distribution of possible delays is not necessarily Gaussian. Like bell curve 506, bell curve 510 is presented for the sake of illustration only.) As can be seen, from FIG. 5E, the second edge selection circuit 402 exhibits a maximum delay, which is identified by reference numeral 512. $FD_2$ is chosen to be equal to (or slightly greater than) the sum of the maximum delay 512 exhibited by the second edge selection circuit 118 and the aforementioned set-up time, $C_2$, required by the second flip flop 406. Thus, the fourth rising edge 504 propagates through the second fixed delay element 402 and arrives at the clock input of the second flip flop 406 at a point in time $FD_2$ seconds later than it was received by the second edge selection circuit 118. Accordingly, the second flip flop 406 presents the fourth rising edge 504 at its output at a point in time $FD_2+E_2$ seconds later than it was received by the second edge selection circuit 118, where $E_2$ represents the aforementioned substantially constant delay exhibited by the second flip flop 406 (this is depicted in FIG. 5G).

The aforementioned description assumes that the first and second flip flops 404 and 406 are the same brand and part number, and therefore exhibit the substantially similar delay, i.e., that $E_1 \approx E_2$. The import of the foregoing is that the interval, I, between the second and fourth rising edges 502 and 504 may be found by the time interval measurement circuitry 116 by subtracting the difference between $FD_1$ and $FD_2$ from the measured interval, as shown in FIG. 5G, i.e., I=Measured Interval-$(FD_1-FD_2)$. Notably, assuming that $FD_1=FD_2$, and further assuming that $E_1=E_2$, then the measured interval is equal to interval, I, between the second and fourth rising edges 502 and 504, and no correction is needed. Of course, assuming the general case in which $FD_1 \neq FD_2$ and $E_1 \neq E_2$, then I=Measured Interval-$(FD_1+E_1-FD_2-E_2)$, because the difference between $FD_1$ and $FD_2$, and the difference between $E_1$ and $E_2$ are constant, meaning that such correction may be made by the time interval measurement circuitry 116.

As mentioned previously, the foregoing scheme generally assumes that the delay imposed by the fixed delay elements 400 and 402 is equal to, or slightly larger than, the maximum delay exhibited by their respective edge selection circuits 114 and 118 plus the needed set-up time ($C_1$ or $C_2$) for the respective D flip flops 404 and 406. For the sake of manufacturability, it may be desirable to arrange the edge selection circuitry 114 and 118 to impose a selectable variable delay at their respective output stages, so that their respective delays are equal to $D_1+\epsilon_1$ and $D_2+\epsilon_2$, where $\epsilon_1$ and $\epsilon_2$ represent the aforementioned chosen variable delay. For example, the output stage of each edge selection circuit 114 and 116 may include a comparator biased with a reference voltage that is chosen to impose a delay on the selected edge. Assuming a comparator is used to generate the delay, and assuming that a rising edge is selected, then the greater the reference voltage, the longer the delay, and the lower the reference voltage, the shorter the delay (the selected variable delay, $\epsilon_1$ or $\epsilon_2$, can be as short as 0 seconds or as long as the rise time of a logic level transition). Such flexibility is useful, when, for instance, the fixed delay elements 400 and 402 are embodied as coaxial cables of a predetermined length. In order to satisfy the aforementioned condition that the delay imposed by the fixed delay elements 400 and 402 is equal to, or slightly larger than, the maximum delay exhibited by their respective edge selection circuits 114 and 118 plus the needed set-up time ($C_1$ or $C_2$) for the respective D flip flops 404 and 406, the delay of the edge selection circuits 114 and 118 may be altered by changing the bias of the reference voltage on the aforementioned comparators, in order to bring about the aforementioned condition.

Figure 6:
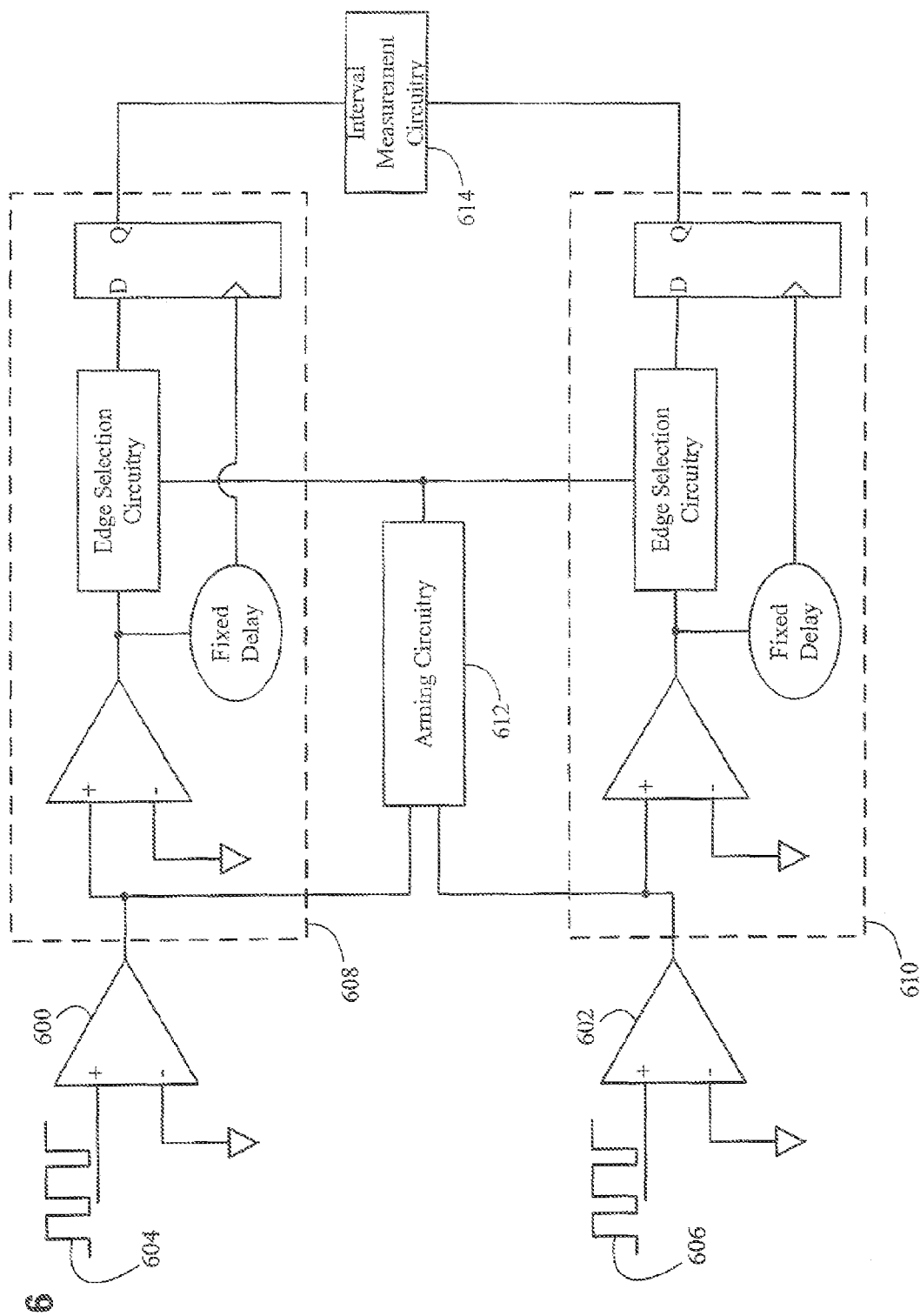
FIG. 6 depicts an embodiment of the system of FIG. 4, in which a time interval may be measured between edges of different signals.

FIG. 6 depicts an embodiment of the measurement system in which rising edges from two different signals may be selected for time interval measurement. As can be seen from FIG. 6, the front end of the measurement system includes first and second amplifiers 600 and 602 that receive first and second signals 604 and 606. The first amplifier 600 delivers an amplified and isolated replica of the first signal 604 to a first distortion-reduced edge selection system 608, and to an arming circuit 612. Similarly, the second amplifier 602 delivers an amplified and isolated replica of the second signal 606 to a second distortion-reduced edge selection system 610, and to the arming circuit 612. The edge selection systems 608 and 610 are constructed and operate as described with reference to distortion-reduced edge selection systems 401 and 403 in FIG. 4. Like the arming circuit of FIG. 4, the arming circuit 612 of FIG. 6 operates so as to instruct the edge selection circuits within each edge selection system 608 and 610 when to start counting edges or to otherwise being the edge selection process. The outputs of each edge selection system 608 and 610 are coupled to a time interval measurement system 614, which measures the time interval between the edges selected by the aforementioned selection systems 608 and 610, and corrects the measured interval according to the correction process described with reference to FIG. 5. Thus, by virtue of the foregoing arrangement, the system of FIG. 6 may operate so as to determine a span of time separating logic level transitions in two different signals (e.g., to find the span of time separating the second rising edge in the first data signal 604 from the fourth rising edge in the second data signal 606).

Figure 7:
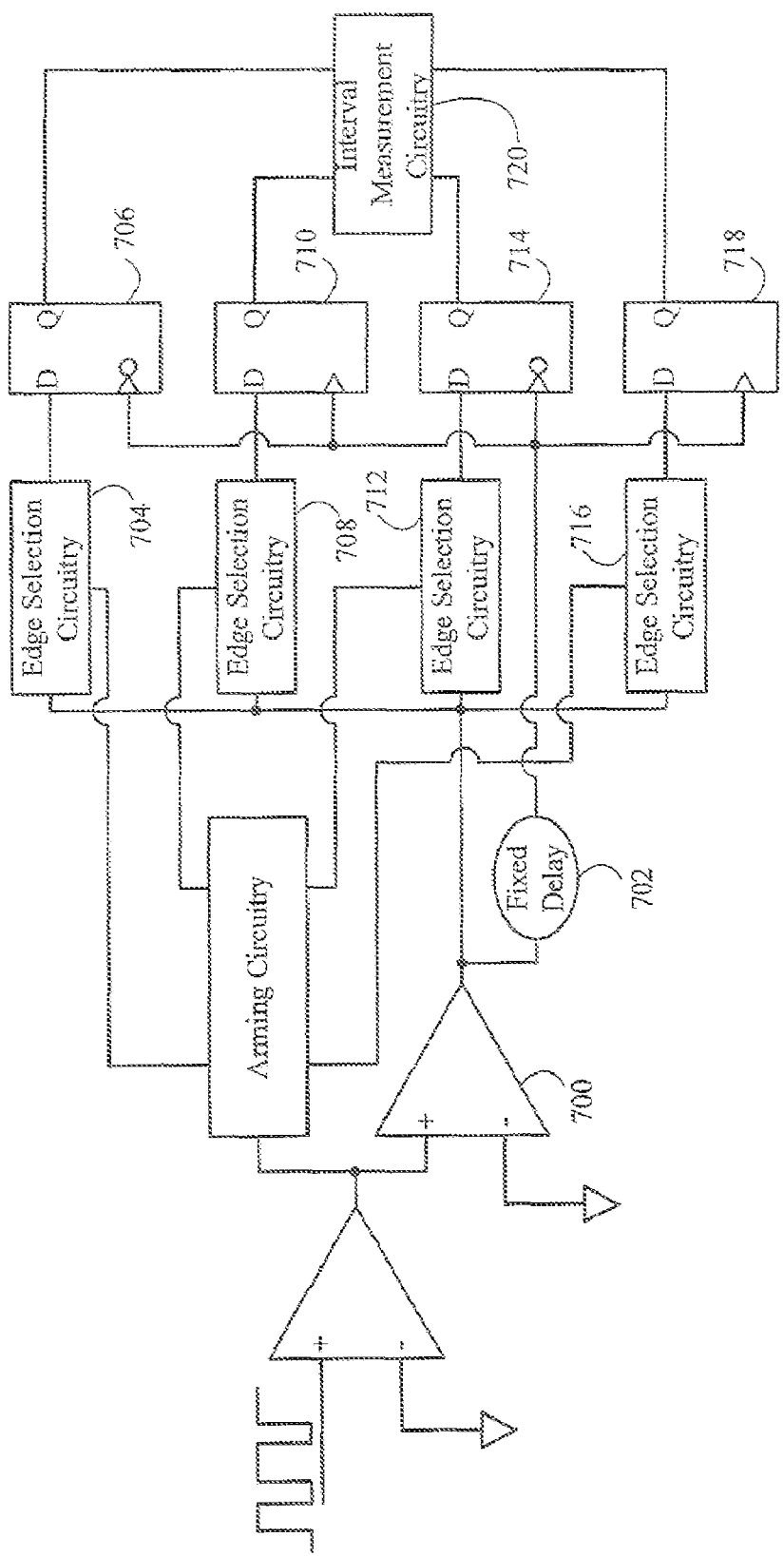
FIG. 7 depicts an embodiment of the system of FIG. 4, in which a time interval may be measured between rising and falling edges.

FIG. 7 depicts an embodiment of the measurement system having four edge selection systems: (1) a first edge selection system including front-end amplifier 700, fixed delay element 702, edge selection circuitry 704, and D flip flop 706; (2) a second edge selection system including front-end amplifier 700, fixed delay element 702, edge selection circuitry 708, and D flip flop 710; (3) a third edge selection system including front-end amplifier 700, fixed delay element 702, edge selection circuitry 712, and D flip flop 714; and (4) a fourth edge selection system including front-end amplifier 700, fixed delay element 702, edge selection circuitry 716, and D flip flop 718. The four aforementioned edge selection systems operate as described with reference to FIGS. 4 and 5, and are coupled to a time interval measurement system 720 that measures the time interval separating a selected pair of edges supplied thereto, as described previously herein.

The system of FIG. 7 includes two D flip flops 706 and 714 that have inverted clock inputs. Therefore, these flip flops 706 and 714 may be used for selection of falling edges (the previous examples herein have assumed selection of rising edges). Accordingly, the system of FIG. 7 may measure the span of time between two rising edges (using the edges from flip flops 710 and 718), between two falling edges (using the edges from 706 and 714), between a rising edge and a subsequent falling edge (using the edges from flip flops 710 and 714, and between a falling edge and a subsequent rising edge (using the edges from flip flops 710 and 718).

Additionally, it should be noted that the front-end amplifier 700 and fixed delay element 702 are shared by all four of the aforementioned edge selection systems, thereby reducing the number of components needed, and the associated cost with each component.

It is to be noted that the embodiments of FIGS. 6 and 7 may be combined, so that time intervals between rising and falling edges on different signals may be measured.

The various embodiments described above are provided by way of illustration only and should not be construed to limit the invention. Those skilled in the art will readily recognize various modifications and changes that may be made to the present invention without following the example embodiments and applications illustrated and described herein, and without departing from the true spirit and scope of the present invention, which is set forth in the following claims.

What is claimed is:

1. A method of preparing a signal for measurement, the method comprising:
   receiving the signal;
   selecting a first edge within the signal;
   selecting a second edge within the signal;
   delivering the first edge to a time interval measurement system after expiration of a first delay period; and
   delivering the second edge to a time interval measurement system after expiration of a second delay period;
   wherein the first delay period is adjusted to be substantially independent of frequency and/or thermally dependent distortion sources.

2. The method of claim 1, further comprising:
   measuring a span of time between the first edge and the second edge with the time interval measurement system.

3. The method of claim 1, further comprising:
   buffering the signal prior to selection of the first and second edges.

4. The method of claim 1, wherein the second delay period is adjusted to be substantially independent of frequency and/or thermally dependent distortion sources.

5. The method of claim 4, wherein the first and second delay period are produced by one or more delay elements that are substantially independent of distortion sources.

6. The method of claim 1, wherein the act of selecting the first edge occurs over a first interval of time, and wherein the first delay period is chosen so as to be at least as long as the first interval of time.

7. The method of claim 1, wherein the act of selecting the second edge occurs over a second interval of time, and wherein the second delay period is chosen so as to be at least as long as the second interval of time.

8. A method of preparing a signal for measurement, the method comprising:
   receiving the signal;
   selecting a first edge within the signal;
   selecting a second edge within the signal;
   delivering the first edge to a time interval measurement system after expiration of a first delay period; and
   delivering the second edge to a time interval measurement system after expiration of a second delay period;
   wherein the act of delivering the first edge to a time interval measurement system after expiration of a first delay period comprises:
      delivering a reproduction of the first edge to a first state device, after elapsing of an interval of time equal to the first delay period; and
      delivering the first edge to the first state device prior to delivery of the reproduction of the first edge, so that the first state device transitions to a state determined by the first edge upon delivery of the reproduced first edge.

9. The method of claim 8, wherein the act of delivering the second edge to a time interval measurement system after expiration of a second delay period comprises:
   delivering a reproduction of the second edge to a second state device, after elapsing of an interval of time equal to the second delay period; and
   delivering the second edge to the second state device prior to delivery of the reproduction of the second edge, so that the second state device transitions to a state determined by the second edge upon delivery of the reproduced second edge.

10. The method of claim 9, wherein the second state device a flip flop.

11. The method of claim 9, wherein the second state of delivery exhibits a quality whereby if the second edge arrives at the second device earlier than the arrival of the reproduced second edge by an amount of time equal to a set-up time, then the change of state exhibited by the second state device occurs over a substantially constant period, wherein the act of selecting the second edge occurs over a second interval of time, and wherein the second delay period is chosen so as to be equal to the sum of the second interval of time and the set-up period.

12. The method of claim 8, wherein the first state device is a flip flop.

13. The method of claim 8, wherein the act of delivering the reproduced first edge to the first state device, after elapsing of the interval of time equal to the first delay period comprises propagating the reproduced first edge through a delay element.

14. The method of claim 13, wherein the delay element is a length of a coaxial cable, trace on a printed circuit board or any suitable element that produces a substantially constant distortion free delay.

15. The method of claim 8, wherein the first state device exhibits a quality whereby if the first edge arrives at the state device earlier than the arrival of the reproduced first edge by an amount of time equal to a set-up time, then the change of state exhibited by the first state device occurs over a substantially constant period, wherein the act of selecting the first edge occurs over a first interval of time, and wherein the first delay period is chosen so as to be equal to the sum of the first interval of time and the set-up period.

16. A system for measurement of a time interval, the system comprising:
   a first edge selection circuit configured to receive a signal, to select a first transition within the signal, said selection occurring over a first span of time, and to deliver the first selected transition to a first state device upon elapsing of the first span of time;
   a second edge selection circuit configured to receive the signal, to select a second transition within the signal, said selection occurring over a second span of time, and to deliver the second selected transition to a second state device upon elapsing of the first span of time;
   a first delay element configured to deliver a pulse to the first state device at a point in time following the elapsing of the first span of time, so that the first state device assumes a state determined by the first selected transition; and
   a second delay element configured to deliver a pulse to the second state device at a point in time following the elapsing of the second span of time, so that the second device assumes a state determined by the second selected transition;
   wherein the first and second delay element are selected to be substantially independent of frequency and/or thermally dependent distortion sources.

17. The system of claim 16, further comprising a time interval measurement system configured to receive the assumed state of the first state element and the assumed state of the second state element, and to measure an interval of time between the reception of the first assumed state and reception of the second assumed state.

18. The system of claim 16, wherein the first span of time or second span of time is adjustable.

19. The system of claim 16, wherein the delay element is one of a length of coaxial cable, a trace on a printed circuit board, and a circuit element that produces a substantially constant distortion free delay.

20. A method of preparing a signal for measurement, the method comprising:
   a) receiving the signal;
   b) selecting a first edge within the signal;
   c) selecting a second edge within the signal;
   d) delivering the first edge to a time interval measurement system after expiration of a first delay period; and
   e) delivering the second edge to a time interval measurement system after expiration of the first delay period;
   wherein the first delay period is adjusted to be substantially independent of frequency and/or thermally dependent distortion sources.

* * * * *